United States Patent [19]

Blanken et al.

[11] Patent Number: 4,868,518

[45] Date of Patent: Sep. 19, 1989

[54] QUIESCENT CURRENT SETTING FOR AN AMPLIFIER CIRCUIT

[75] Inventors: Pieter G. Blanken; Jan R. De Boer, both of Eindhoven, Netherlands

[73] Assignee: U.S. Philips Corporation, New York, N.Y.

[21] Appl. No.: 264,752

[22] Filed: Oct. 31, 1988

[30] Foreign Application Priority Data

Nov. 20, 1987 [NL] Netherlands ............... 8702778

[51] Int. Cl.$^4$ ............... H03F 3/26; H03F 3/16
[52] U.S. Cl. ............... 330/264; 330/267; 330/296; 330/277
[58] Field of Search ............... 330/263, 264, 267, 277, 330/288, 296, 307

[56] References Cited

U.S. PATENT DOCUMENTS 4,038,607 7/1977 Schade, Jr. ............... 330/296 X

OTHER PUBLICATIONS

Tietze, V. and Schenk, Ch., *Halbleiterschaltungstechnik*, Springer Verlag, 1980, p. 350.

Gray, P. R. and Meyer, R. G., *Analysis and Design of Analog ICs*, John Wiley, New York, 1984, p. 410.

*Primary Examiner*—Steven Mottola
*Attorney, Agent, or Firm*—Bernard Franzblau

[57] ABSTRACT

An amplifier circuit, for example, a class AB output stage, includes a series arrangement of a first transistor ($T_1$) and a second transistor ($T_2$), both arranged as diodes, a series arrangement of a third transistor ($T_3$) and a fourth transistor ($T_4$) and a series arrangement of a fifth transistor ($T_5$) and an impedance (R). The first main electrode of the first transistor ($T_1$) is coupled via the impedance (R) to the control electrode of the fourth transistor ($T_4$). The first main electrodes of the second and fifth transistors ($T_2$, $T_5$) are coupled together and to the control electrode of the third transistor ($T_3$). The control electrodes of the first, second and fifth transistors ($T_1$, $T_2$ and $T_5$) are coupled together and to the second main electrodes of the first and the second transistor. This circuit provides a small quiescent current in the output transistors using relatively small input transistors ($T_1$, $T_2$) and relatively large output transistors ($T_3$, $T_4$).

8 Claims, 1 Drawing Sheet 4,868,518

QUIESCENT CURRENT SETTING FOR AN AMPLIFIER CIRCUIT

BACKGROUND OF THE INVENTION

This invention relates to an amplifier circuit comprising an input terminal, a series arrangement of a first transistor of a first conductivity type and a second transistor of a second conductivity type both arranged as diodes, and a series arrangement of a third transistor of the first conductivity type and a fourth transistor of the second conductivity type, each transistor having a first and a second main electrode and a control electrode, the control electrodes of the first and the second transistor being interconnected, the first main electrode of the first transistor being coupled to the control electrode of the fourth transistor, the first main electrode of the second transistor being coupled to the control electrode of the third transistor, and the intercoupled first main electrodes of the third and the fourth transistor being also coupled to an output terminal.

An amplifier circuit of this type is known from the book "Analysis and design of analog integrated circuits" by P. R. Gray and R. G. Meyer, John Wiley, New York, 1984, page 335 and is intended to be used as a complementary source or emitter follower output stage in a class AB amplifier. Thus, the first main electrode is the emitter if bipolar transistors are concerned and the source if unipolar transistors (such as MOS transistors and JFETs) are concerned. The second main electrode (that is to say, the collector or drain) of the first transistor is coupled to the associated control electrode of this transistor. The second main electrode of the second transistor is coupled to its associated control electrode. The control electrodes of the first and the second transistor are interconnected. The quiescent output current $I_{out}$ through the third and the fourth transistor, which operate as output transistors, and the quiescent input current $I_{in}$ through the first and the second transistor are in the ratio of $I_{out}=I_{in}/n$ in which for bipolar transistors n is the emitter surface ratio $A_E$ of the first transistor with respect to the third transistor and of the second transistor with respect to the fourth transistor (hence $n=A_{E1}/A_{E3}=A_{E2}/A_{E4}$) and in unipolar transistors n, is the W/L ratio and is $(n=(W/L)_1: (W/L)_3=(W/L)_2 : (W/L)_4$ in which W is the channel width and L is the channel length.

In some uses of the amplifier circuit it is necessary that the quiescent output current $I_{out}$ be small as compared with the input current $I_{in}$. This means that n must be large. This implies that the first and second transistors, arranged as diodes, must be larger than the third and the fourth transistors. The third and fourth transistors are large anyway because they must be able to supply the large output current required for a class AB amplifier.

If integrated, the amplifier circuit thus realized occupies an undesirably large part of the chip surface area. Moreover, the first and second transistors then have a large parasitic capacitance with respect to the substrate.

To obviate these problems it is known to decrease the voltage drop across the first and the second transistor, for example, (a) by omitting one of the two transistirs, see, for example, the book by Gray and Meyer, page 410, (b) or by arranging negative feedback resistors in the output circuit constituted by the third and the fourth transistor, see, for example, U. Tietze and Ch. Schenk, Halbleiterschaltungstechnik, Springer Verlag 1980, page 350.

All of these solutions have their specific drawbacks. A major drawback of the first-mentioned solution is that the symmetry in the amplifier circuit is lost. Spreads in the threshold voltage of the transistor whose transistor diode of the corresponding conductivity type has been omitted then influence the quiescent output current $I_{out}$, which is undesirable.

A drawback of the second solution is that the resistance must be large so that a large chip surface area is required in the case of integration and moreover the output impedance of the amplifier circuit increases.

SUMMARY OF THE INVENTION

The invention proposes to provide an amplifier circuit occupying a small chip surface area and having a small parasitic capacitance and a considerable insensitivity to threshold voltages. To this end the amplifier circuit according to the invention is characterized in that a series arrangement of an impedance and a fifth transistor of the second conductivity type is arranged parallel to the series arrangement of the first and the second transistor, the control electrode of the second transistor being coupled to the control electrode of the fifth transistor, the first main electrode of the first transistor being coupled via the impedance to the control electrode of the fourth transistor and the first main electrode of the second transistor being coupled to the first main electrode of the fifth transistor.

This provides the possibility of realizing an amplifier circuit in the form of a class AB output stage with relatively small input transistors and relatively large output transistors which nevertheless makes possible a small quiescent current in the output transistors. More particularly, particularly a design in (BI)MOS of this amplifier circuit will now be possible.

The impedance is preferably a resistor having a resistance R which is equal to $(1/S_1+1/S_2)$ $1/m$ in which $S_1$ and $S_2$ are the transconductance of the first and the second transistor, respectively, and m is the ratio of the gain factor of the fifth transistor with respect to that of the second transistor, hence $m=(W/L)_5 : (W/L)_2$ for unipolar transistors. Consequently, the quiescent output current can be made even more insensitive to variations in the input current flowing through the parallel arrangement of the series-arranged first and second transistors and the series-arranged arranged impedance and fifth transistor.

BRIEF DESCRIPTION OF THE DRAWING

The invention will now be described in greater detail, by way of example, with reference to the accompanying drawing, in which.

DESCRIPTION OF THE PREFERRED EMBODIMENTS

Figure 1:
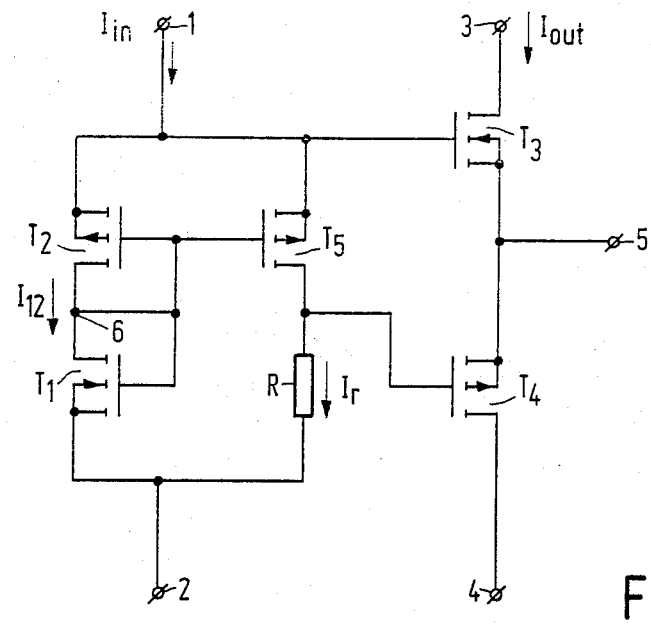
FIG. 1 shows a first embodiment.

FIG. 1 shows an amplifier circuit in the form of a class AB output stage; comprising a series arrangement of a first and a second transistor $T_1$ and $T_2$, respectively, both in the form of a MOSFET, coupled between the terminals 1 and 2. The first transistor $T_1$ is a MOSFET of the n-type and the second transistor is a MOSFET of the p-type. Both transistors are arranged as diodes. This means that the control electrode (gate) of each of the two transistors is coupled to the one (namely the second) main electrode (the drain) of the relevant transistor. A series arrangement of a third transistor $T_3$ and a fourth transistor $T_4$ is provided between terminals 3 and 4. The third transistor is a MOSFET of the n-type and the fourth transistor is a MOSFET of the p-type. The source-main electrodes of the two transistors $T_3$ and $T_4$ are coupled together and are coupled to an output terminal 5 of the amplifier circuit.

The source-main electrode of the transistor $T_2$ is coupled to the control electrode of the transistor $T_3$. The source-main electrode of the transistor $T_1$ is coupled via an impedance in the form of a resistor R to the control electrode of the transistor $T_4$.

A series arrangement of the impedance R and a fifth transistor $T_5$ is arranged parallel to the series arrangement of the transistors $T_1$ and $T_2$ between the terminals 1 and 2. The source-main electrodes of the transistors $T_2$ and $T_5$ are coupled together and to the terminal 1. Similarly, the control electrodes (gates) of the transistors $T_2$ and $T_5$ are coupled together.

The source-main electrode of transistor $T_1$ is coupled to the terminal 2. Quiescent currents $I_{in}$ and $I_{out}$ flow in the circuits. The quiescent input current $I_{in}$ flows from terminal 1 to terminal 2 and spreads over the two parallel-arranged circuits constituted by the transistors $T_1$ and $T_2$ through which a quiescent current $I_{12}$ flows and constituted by the transistor $T_5$ and the impedance R through which a quiescent current $I_r$ flows.

The quiescent output current $I_{out}$ flows from terminal 3 via the transistors $T_3$ and $T_4$ to terminal 4. The quiescent current $I_{in}$ is supplied by a current source (not shown) which is connected to one of the terminals 1 or 2. An input signal to be amplified by the amplifier circuit may be applied to one of the terminals 1 or 2, or to the terminal 6, i.e. the junction point between the drain-main electrodes of the transistors $T_1$ and $T_2$. The (current-) amplified output signal is present at the output terminal 5. The terminals 3 and 4 are coupled to suitable supply voltages.

The transistors $T_1$ and $T_2$ create a voltage drop whose value is determined by the threshold voltages and the gain factors of $T_1$ and $T_2$ and the current ($I_{12}$) through $T_1$ and $T_2$. A voltage drop which is subtracted from the voltage drop across $T_1$ and $T_2$ is created across the resistor R. The current $I_r$ through resistor R is coupled to the current $I_{12}$ through $T_1$ and $T_2$ via the transistor $T_5$ which forms a current mirror with $T_2$. If $T_5$ has a W/L ratio which is larger by a factor of m as compared with $T_2$, it holds that $$I_r = I_{in} \cdot m/(m+1)$$

and $$I_{12} = I_{in}/(m+1).$$

It is possible to render the quiescent output current $I_{out}$ insensitive to variations in $I_{in}$ by choosing the value of resistor R such that $$m \cdot R = (1/S_1 + 1/S_2)$$

in which $S_1$ and $S_2$ are the slopes of collector current Vs. B/E voltage characteristic with the C/E voltage constant (i.e. transconductance) of $T_1$ and $T_2$, respectively. The quiescent output current $I_{out}$ is dependent on the value of R and the value of $I_{in}$ and the gain factors of the four transistors $T_1$ to $T_4$. In MOS processes this could be considered a drawback because the value of the (poly)sheet resistor R is not accurately laid down. In modern (Bi)MOS processes this drawback does not play a role because accurate implanted resistors are available.

Figure 2:
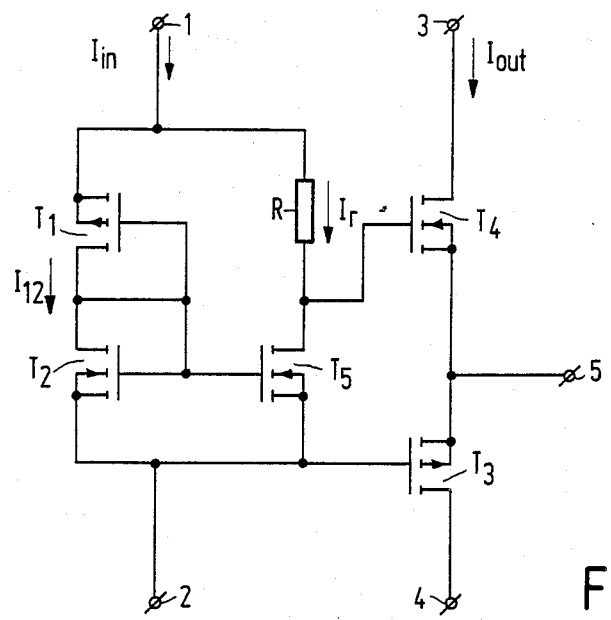
FIG. 2 shows a second embodiment of the amplifier circuit.

FIG. 2 shows a second embodiment bearing a great resemblance to the embodiment of FIG. 1. The transistors $T_1$ and $T_2$ are arranged in the reverse order in the circuit between the terminals 1 and 2. Moreover, the transistors are of a different conductivity type. Transistor $T_1$ is of the p-type and transistor $T_2$ is of the n-type. The same applies to the transistors $T_3$ and $T_4$. Similarly, the transistor $T_5$ and the impedance R have a reversed order and the transistor $T_5$ is of the different conductivity type (namely the n-type). The operation of the circuit of FIG. 2 is not principally different from that of the circuit of FIG. 1 so that it does not require any further explanation. In summary, the advantages are:

1. The transistor symmetry is maintained: the quiescent output current $I_{out}$ is insensitive to the values of the threshold voltages as long as transistors of the same conductivity type have the same threshold voltage, which is the case on an integrated circuit.

2. The number of required insulation islands is small: only 2, namely one island for the transistor $T_1$ and one island for the transistors $T_2$, $T_5$ and the impedance R.

3. The "diodes" $T_1$ and $T_2$ and the mirror transistor $T_5$ may be small, which is favourable for a small chip surface area and a small parasitic capacitance.

4. The output impedance of the output stage does not increase due to the provision of the resistor R.

5. At a relatively low value of R a considerable voltage drop can still be obtained because $I_{in}$ is relatively large.

6. The admissible voltage drop across R, being the sum of the threshold voltage of $T_2$ and the voltage drop across $T_1$, is large; there is little risk of setting the transistors outside their saturation range.

7. The simple application in modern (Bi)MOS processes.

It is to be noted that the invention is not limited to the amplifier circuit shown in the embodiments. The invention can also be used for those amplifier circuits which differ from the embodiments shown in aspects not relating to the invention. For example, an amplifier circuit in which the transistors are in the form of bipolar transistors is also possible.

What is claimed is:

1. An amplifier circuit comprising: an input terminal, a series arrangement of a first transistor of a first conductivity type and a second transistor of a second conductivity type, both connected as diodes, a series arrangement of a third transistor of the first conductivity type and a fourth transistor of the second conductivity type, each transistor having a first and a second main electrode and a control electrode, the control electrodes of the first and the second transistor being interconnected, the first main electrode of the second transistor being coupled to the control electrode of the third transistor, the intercoupled first main electrodes of the third and the fourth transistor also being coupled to an output terminal, a series arrangement of an impedance and a fifth transistor of the second conductivity type connected parallel to the series arrangement of the first and the second transistor, the control electrode of the second transistor being coupled to a control electrode of the fifth transistor, the first main electrode of the first transistor being coupled via the impedance to the control electrode of the fourth transistor and the first main electrode of the second transistor being coupled to the first main electrode of the fifth transistor.

2. An amplifier circuit as claimed in claim 1, wherein the impedance is a resistor having a resistance R which is equal to $(1/S_1+1/S_2)$ $1/m$ in which $S_1$ and $S_2$ are the transconductance characteristics of the first and the second transistor, respectively, and m is the ratio of the gain factor of the fifth transistor with respect to the gain factor of the second transistor.

3. An amplifier circuit comprising:
first and second terminals for a quiescent input current,
third and fourth terminals for a quiescent output current,
first and second transistors, each connected as a diode,
third, fourth and fifth transistors each having a control electrode,
means connecting said first and second transistors in a first series circuit between said first and second terminals,
means connecting said third and fourth transistors in a second series circuit between said third and fourth terminals,
means connecting said fifth transistor and an impedance element in a third series circuit between said first and second terminals,
means coupling a first main electrode of the first transistor via said impedance element to the control electrode of the fourth transistor,
means coupling control electrodes of the first, second and fifth transistors together and to a junction between second main electrodes of the first and second transistors, and
means coupling first main electrodes of the second and fifth transistors together and to the control electrode of the third transistor.

4. An amplifier circuit as claimed in claim 3, wherein said impedance element comprises a resistor having a resistance $R=(1/S_1+1/S_2)/m$, where $S_1$ and $S_2$ are the transconductance characteristics of the first and second transistors, respectively, and m is the ratio of the gain of the fifth transistor with respect to the gain of the second transistor.

5. An amplifier circuit as claimed in claim 3, further comprising an output terminal of the amplifier circuit coupled to a junction point between the third and fourth transistors.

6. An amplifier circuit as claimed in claim 5, wherein said first and third transistors comprise transistors of a first conductivity type and said second, fourth and fifth transistors comprise transistors of a second conductivity type.

7. An amplifier circuit as claimed in claim 5, further comprising a signal input terminal coupled to one of said first terminal, said second terminal and a junction point between said first and second transistors.

8. An amplifier circuit as claimed in claim 5, wherein said second and fifth transistors together comprise a current mirror, said amplifier circuit being a class AB amplifier in which a quiescent output current flows through the third and fourth transistors that is small relative to a quiescent current supplied by said first and second terminals.

* * * * *